US011916516B2

United States Patent
Agarwal et al.

(10) Patent No.: US 11,916,516 B2
(45) Date of Patent: *Feb. 27, 2024

(54) LOW POWER OPERATIONAL AMPLIFIER TRIM OFFSET CIRCUITRY

(71) Applicant: TEXAS INSTRUMENTS INCORPORATED, Dallas, TX (US)

(72) Inventors: Nitin Agarwal, Bangalore (IN); Kunal Karanjkar, Bangalore (IN); Venkata Ramanan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/155,261

(22) Filed: Jan. 17, 2023

(65) Prior Publication Data

US 2023/0155553 A1    May 18, 2023

Related U.S. Application Data

(63) Continuation of application No. 16/701,629, filed on Dec. 3, 2019, now Pat. No. 11,558,013.

(51) Int. Cl.
*H03F 1/02* (2006.01)
*H03F 3/45* (2006.01)
*H03M 1/66* (2006.01)

(52) U.S. Cl.
CPC ....... *H03F 1/0211* (2013.01); *H03F 3/45197* (2013.01); *H03M 1/66* (2013.01);
(Continued)

(58) Field of Classification Search
CPC ............... H03F 1/0211; H03F 3/45197; H03F 3/45183; H03F 3/45771; H03F 3/45995;
(Continued)

(56) References Cited

U.S. PATENT DOCUMENTS 6,696,894 B1    2/2004  Huang
7,138,856 B2   11/2006  Laletin
(Continued)

OTHER PUBLICATIONS

International Search Report dated Apr. 1, 2021, PCT Application No. PCT/US2020/062965, 2 pages.

*Primary Examiner* — Andrea Lindgren Baltzell
*Assistant Examiner* — Khiem D Nguyen
(74) *Attorney, Agent, or Firm* — Michael T. Gabrik; Frank D. Cimino

(57) ABSTRACT

Enhanced operational amplifier trim circuitry and techniques are presented herein. In one implementation, a circuit includes a reference circuit configured to produce a set of reference voltages, and a digital-to-analog conversion (DAC) circuit. The DAC circuit comprises a plurality of transistor pairs, where each pair among the plurality of transistor pairs is configured to provide portions of adjustment currents for an operational amplifier based at least on the set of reference voltages and sizing among transistors of each pair. The circuit also includes drain switching elements coupled to drain terminals of the transistors of each pair and configured to selectively couple one or more of the portions of the adjustment currents to the operational amplifier in accordance with digital trim codes.

20 Claims, 8 Drawing Sheets

(52) U.S. Cl.
CPC ............... *H03F 2200/375* (2013.01); *H03F 2203/45044* (2013.01)

(58) Field of Classification Search
CPC ........... H03F 3/45475; H03F 2200/375; H03F 2203/45044; H03F 2200/456; H03F 2203/45354; H03M 1/66; H03M 1/1061; H03M 1/745
USPC ........................................................ 330/253
See application file for complete search history.

(56) References Cited

U.S. PATENT DOCUMENTS

| | | |
|---|---|---|
| 7,973,596 B2 | 7/2011 | Eschauzier et al. |
| 8,476,971 B2 | 7/2013 | Peng et al. |
| 8,497,791 B2 | 7/2013 | Okumura et al. |
| 9,136,864 B1 | 9/2015 | Teterwak et al. |
| 9,503,113 B1 | 11/2016 | Thomsen et al. |
| 11,558,013 B2 * | 1/2023 | Agarwal ............... H03F 1/0211 |
| 2005/0073358 A1 | 4/2005 | Nakahira |

\* cited by examiner

LOW POWER OPERATIONAL AMPLIFIER TRIM OFFSET CIRCUITRY

CROSS-REFERENCE TO RELATED APPLICATIONS

The present application is a Continuation of U.S. patent application Ser. No. 16/701,629 filed Dec. 3, 2019, which is hereby incorporated herein by reference in its entirety.

BACKGROUND

Operational amplifiers, also referred to as op-amps, are widely used circuit elements used across a variety of analog electronic designs, such as signal amplifiers, signal comparators, differential amplifiers, feedback circuitry, and various oscillators, among other circuit topologies. Many circuit configurations for operational amplifiers produce an output signal representative of a difference between two differential inputs. However, input stages of op-amps can have various imbalances among differential input circuitry which can lead to voltage offsets corresponding to inaccuracies in output signals, among other effects. These imbalances can be due to manufacturing differences, fabrication limits, thermal variations, circuit non-linearities, or other variations.

Operational amplifiers can include precision-trimmed transistor features or additional trimming circuitry that can adjust for offsets between differential inputs and attempt to compensate for the aforementioned imbalances. This trimming circuitry can include circuitry that couples to external pins or connections of an op-amp circuit to add compensating resistances, voltages, or currents to attempt to 'zero out' any offsets among input stages of the op-amp. Other designs include digitally trimmed op-amps, which accept binary input parameters to produce adjustments to the op-amp offsets. However, when this additional circuitry, such as digital trim circuitry, is employed, the added power consumption of the circuitry can be undesirable, especially in low-power or battery-powered applications.

Overview

Enhanced operational amplifier trim circuitry and techniques are presented herein. In one implementation, a circuit includes a reference circuit configured to produce a set of reference voltages, and a digital-to-analog conversion (DAC) circuit. The DAC circuit comprises a plurality of transistor pairs, where each pair among the plurality of transistor pairs is configured to provide portions of adjustment currents for an operational amplifier based at least on the set of reference voltages and sizing among transistors of each pair. The circuit also includes drain switching elements coupled to drain terminals of the transistors of each pair and configured to selectively couple one or more of the portions of the adjustment currents to the operational amplifier in accordance with digital trim codes.

BRIEF DESCRIPTION OF THE DRAWINGS

While several implementations are described in connection with these drawings, the disclosure is not limited to the implementations disclosed herein.

DETAILED DESCRIPTION

Operational amplifiers, referred to herein as op-amps, can have various inaccuracies exhibited by output signals due in part to offsets within input stage elements. In many examples of op-amps, the input stage can include a pair of transistors which accept differential input signals. Physical and thermal differences among these transistors can lead to the aforementioned offsets, which are exhibited as inaccuracies on an output of the op-amp. Some op-amp circuits include internal or external circuitry to adjust for these offsets and compensate for the inaccuracies. Various enhanced offset trimming circuitry is discussed herein. This trimming circuitry typically includes circuitry to produce one or more currents which are applied to an input stage of an op-amp to compensate for the offsets within the input stage circuitry. However, many compensation circuitry types exhibit large power drains or constant current draws which lead to decreased power performance of op-amp circuits, especially in low-power or battery-powered environments. Advantageously, the examples herein provide for trim current adjustment of op-amp input stage offsets, while reducing power consumption for the trim current adjustment circuitry to 100 nanoamps (nA) or lower.

Figure 1:
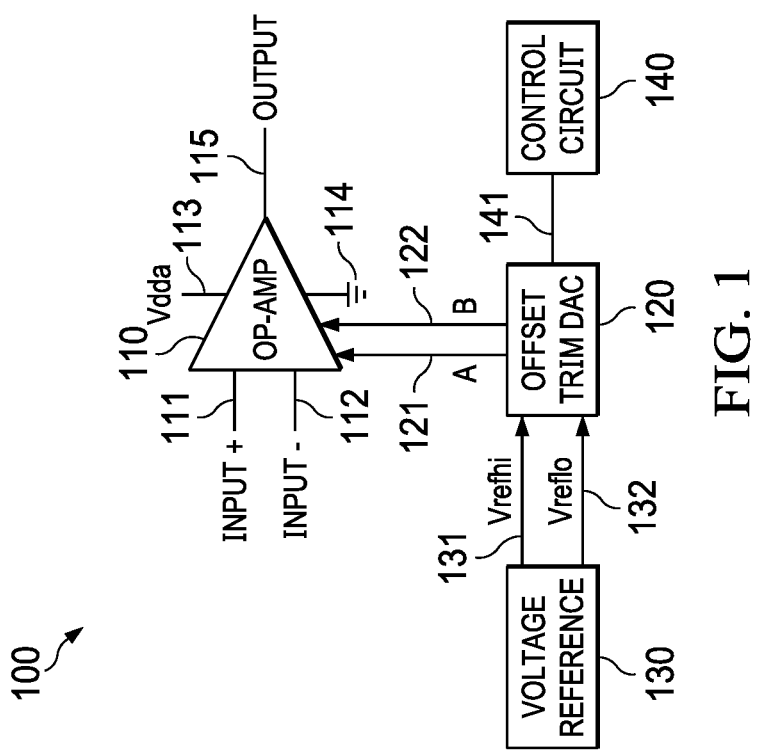
FIG. 1 illustrates an operational amplifier circuit that includes a trim circuit in an implementation.
Figure 2:
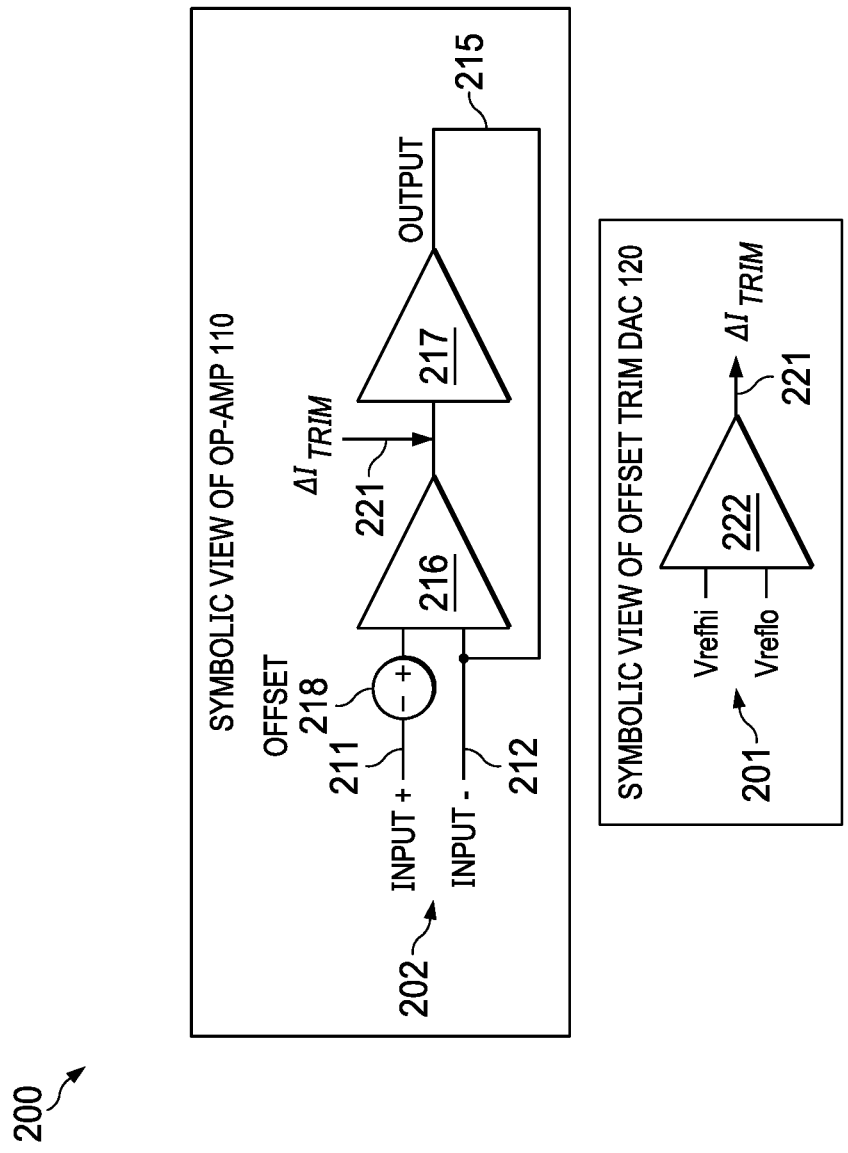
FIG. 2 illustrates symbolic views of an operational amplifier and a trim circuit in an implementation.

FIG. 1 is now presented as an example circuit which employs enhanced trim offset circuitry. In FIG. 1, circuit 100 includes op-amp 110 that schematically represents a target operational amplifier which can have offsets corrected using one or more trim currents. These trim currents are produced by offset trim digital to analog conversion (DAC) circuit 120, which uses voltage reference circuit 130 as a voltage reference. DAC circuit 120 receives control instructions from control circuit 140 over link 141. Two example symbolic circuits for op-amp 110 and offset trim DAC circuit 120 are also shown in FIG. 2 below.

In FIG. 1, op-amp 110 accepts two input signals which form a differential input configuration of input+ signal 111 and input− signal 112. Based on the input signals as well as a gain configuration of differential gain stage, op-amp 110 can produce output signal 115. Voltage supply signals 113-114 are also shown in FIG. 1 which provide power (Vdda) and reference voltages (ground) to op-amp 110. Output signal 115 can have various inaccuracies which arise at least in part from variations among circuitry that forms an input stage of op-amp 110. These inaccuracies in the input stage of op-amp 110 can be represented as a voltage element in series with an input signal, which is shown in FIG. 2 below.

A correction signal, referred to herein as a trim signal or trim current, can be introduced into op-amp 110 as trim signals 121-122 to compensate for at least a portion of the input stage offset. In FIG. 1, trim signals 121-122 are produced by offset trim DAC circuit 120. FIG. 1 shows two reference signals, Vrefhi 131 and Vreflo 132, which are used to produce trim signals 121-122 by offset trim DAC circuit 120. Offset trim DAC circuit 120 senses these two reference voltages (Vrefhi 131 and Vreflo 132) and produces analog trim currents having values reflective of (gm)×(Vrefhi−Vreflo), where gm can be programmed with a digital code introduced by control circuit 140 to offset trim DAC circuit 120. Further examples of offset trim DAC circuit 120 are included in the Figures below.

Additionally, voltage reference 130 is shown which produces a pair of reference voltages, noted above as Vrefhi 131 and Vreflo 132. Voltage reference 130 can comprise various voltage reference circuitry that produce constant voltage signals. Various example reference elements can include bandgap voltage references, voltage divider references, Zener diode references, avalanche diode references, and Josephson junction references, among others. Although several of the examples herein employ bandgap voltage references, it should be understood that different types of voltage references can instead be employed. These bandgap voltage references produce temperature-independent and power supply-independent voltage reference signals based on the band gap for charge carriers of a semiconductor material. Various voltage levels might be produced by voltage reference 130, such as a pair of reference voltages at 0.44 volts and 0.4 volts, among others.

Control circuit 140 comprises specialized circuitry, logic, execution units, or processor elements. Control circuit 140 can comprise one or more microprocessors and other processing circuitry. Control circuit 140 can be implemented within a single processing device but can also be distributed across multiple processing devices or sub-systems that cooperate in executing program instructions. Examples of control circuit 140 include general purpose central processing units, application specific processors, and logic devices, as well as any other type of discrete circuitry, control logic, or processing device, including combinations, or variations thereof. In some examples, control circuit 140 comprises a field-programmable gate array (FPGA), an application-specific integrated circuit (ASIC), application specific processor, or other processing elements.

In operation, op-amp 110 can be characterized by applying reference input voltages on the differential input (e.g., input+ 111 and input− 112) to determine an offset produced on the output 115 of op-amp 110. This offset can comprise a voltage offset, and offset trim DAC circuit 120 can be employed to reduce the voltage offset. Specifically, trim signals 121-122 can be applied to nodes 'A' and 'B' in FIG. 1 by offset trim DAC circuit 120. These trim signals provide offsetting currents to input stage elements of op-amp 110 so as to reduce or eliminate the voltage offset of op-amp 110. To select a proper current level for these trim signals, control circuit 140 can apply control signaling to offset trim DAC circuit 120. This control signaling typically comprises a digital code which selects current levels supplied by one or more granular or incremental current control elements of offset trim DAC circuit 120. Voltage reference 130 provides Vrefhi and Vreflo to offset trim DAC circuit 120 as precision references used by circuitry of offset trim DAC circuit 120 to produce the trim signals. In this manner, precise control over trim signals 121-122 can be achieved by offset trim DAC circuit 120 using a digital control code provided by control circuit 140 over link 141 in conjunction with voltage references Vrefhi and Vreflo provided over links 131-132. Advantageously, more accurate operations and outputs of op-amp 110 are provided.

Turning now to FIG. 2, symbolic representations 201-202 of some of the elements of FIG. 1 are illustrated. These symbolic representations are examples to provide further detail on the configurations of op-amp 110 and offset trim DAC circuit 120 of FIG. 1. It should be understood that other configurations and detailed implementations are possible, as shown by the various Figures below. Circuit 201 illustrates a symbolic representation of offset trim DAC circuit 120. Circuit 202 illustrates a symbolic representation of op-amp 110.

In circuit 202, inaccuracies in an input stage 216 of op-amp 110 can be represented as a voltage offset, shown in FIG. 2 as offset element 218 in series with the input+ signal on link 211. Offset element 218 might instead be shown in series with the input− signal on link 212. Output signal 215 can have various inaccuracies which arise at least in part from physical and thermal variations within circuitry that forms input stage 216. To correct for these inaccuracies in op-amp 110, an offset trim signal can be produced. This offset trim signal can adjust for voltage offsets in input stage 216.

In circuit 201, a trim current ($\Delta I_{TRIM}$) is produced by offset trim stage 222 based in part on reference voltages (Vrefhi and Vreflo). These reference voltages, in conjunction with control signaling not shown in FIG. 2 for clarity, are employed by offset trim stage 222 to produce a trim current as the offset trim signal noted above. This trim current is represented by a single-ended current ($\Delta I_{TRIM}$) in FIG. 2 having a value reflective of (gm)×(Vrefhi−Vreflo), where gm can be programmable by the aforementioned control signaling. Trim current $\Delta I_{TRIM}$ is introduced as shown in circuit 202 over link 221 between input stage 216 and gain stage 217 for adjustment of the offset voltage and correction of inaccuracies in output 215. As will be seen in the Figures below, more detailed configurations of the input stage of an op-amp as well as differential trim currents which allow for adjustments of op-amps having differential input stages. Thus, although a single-ended current $\Delta I_{TRIM}$ is shown in FIG. 2, $\Delta I_{TRIM}$ can represent more than one trim current in the examples below.

Figure 3:
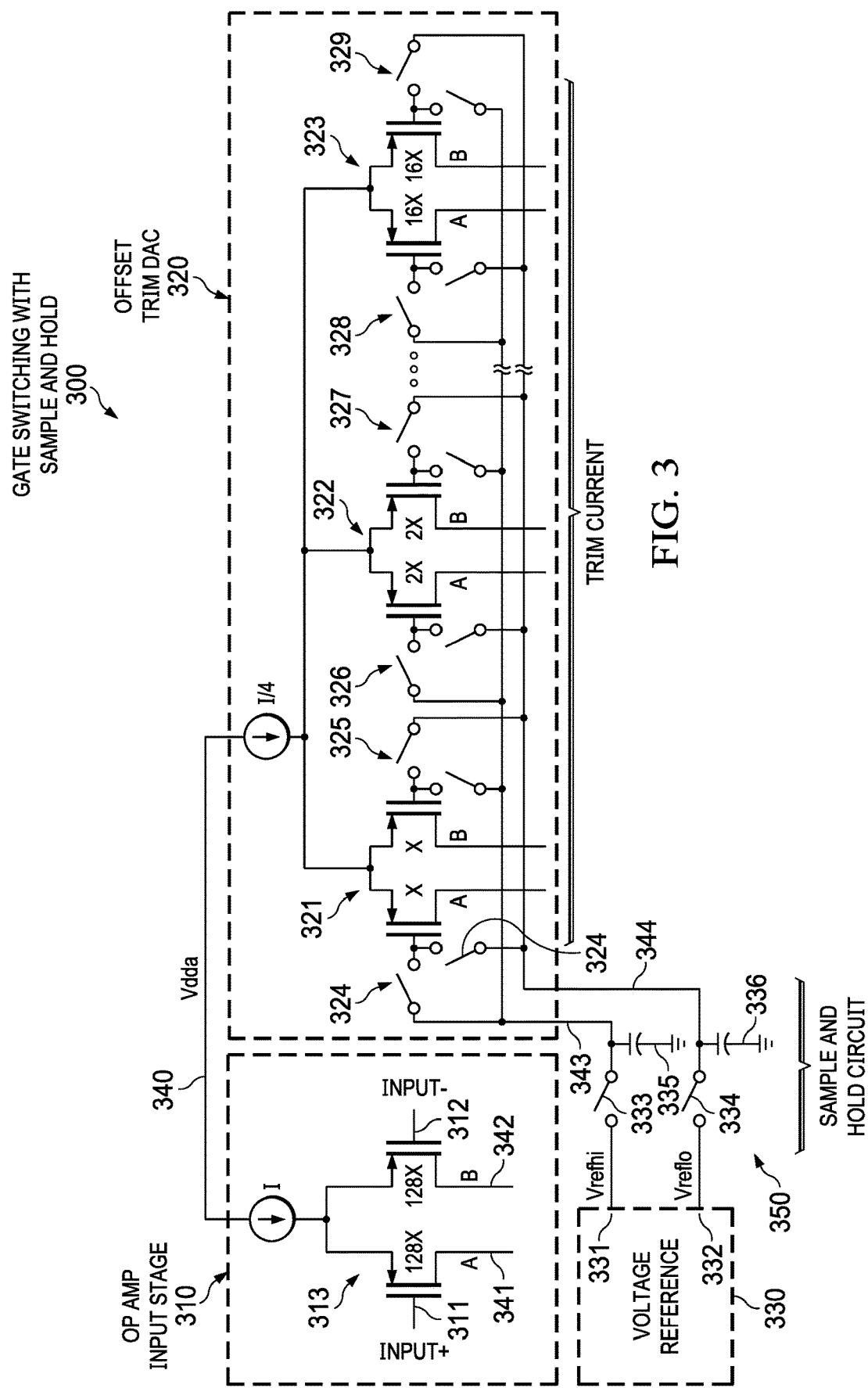
FIG. 3 illustrates portions of an operational amplifier and portions of a trim circuit in an implementation.

To provide a first enhanced circuit topology, FIG. 3 is provided. FIG. 3 includes sample-and-hold circuit 350 that accompanies a bandgap reference circuit 330 to reduce the required constant current of the bandgap reference circuit 330. FIG. 3 includes four main portions comprising circuit configuration 300, namely op-amp input stage 310, offset trim DAC circuit 320, bandgap circuit 330, and sample-and-hold circuit 350. Offset trim DAC circuit 120 of FIG. 1 might incorporate some of the elements of DAC-based trim circuit 320, and it should be understood that offset trim DAC circuit 120 can instead employ different configurations as described in FIG. 3. Also, a supply voltage 340 (Vdda) is included to illustrate a voltage source for current to be supplied to op-amp input stage 310 and offset trim DAC circuit 320. The particular voltage level will vary based upon implementation, but might comprise 3.3-12 volts, among other voltage levels. Other configurations of supply voltage can be employed, such as separate supply voltages.

Typically, an op-amp will have an input stage portion that accepts one or more external signals for amplification to produce an output based on a gain characteristic of a gain stage. In FIG. 3, op-amp input stage 310 illustrates an example input stage portion of op-amp 110 of FIG. 1 or input stage 216 of FIG. 2. In this instance, input signals to the input stage comprise differential inputs having positive and negative input terminals. Specifically, op-amp input stage 310 accepts two input signals 311-312 which comprise a differential input configuration formed by input+ signal 311 and input− signal 312. Based on input signals 311-312 as well as a gain configuration of a differential gain stage (not shown in FIG. 3 for clarity), an associated op-amp that includes op-amp input stage 310 can produce an output signal. This output signal can have various inaccuracies which arise at least in part from variations among circuitry that forms op-amp input stage 310. Specifically, each transistor in transistor pair 313 might have slightly different characteristics due to manufacturing irregularities, thermal differences, non-linearities, sizing inaccuracies, or other factors. A correction signal, referred to herein as a trim signal or trim current, can be introduced into op-amp input stage 310 at nodes 'A' and 'B' on links 341-342 to compensate for at least a portion of the input stage offset among transistor pair 313. In FIG. 1, this trim signal is indicated by trim signals 121-122, and in FIG. 3 a trim current is represented by two currents at nodes 'A' and 'B' which can each adjust for characteristics of a particular transistor among transistor pair 313.

Bandgap circuit 330 provides at least two reference voltages to offset trim DAC circuit 320 (Vrefhi and Vreflo) at terminals 331-332. However, sample-and-hold circuit 350 is coupled between terminals 331-332 and links 343 and 344. Example reference voltages provided by bandgap circuit 330 might correspond to voltage levels of 0.44 volts for Vrefhi and 0.4 volts for Vreflo presented at terminals 331-332 of bandgap circuit 330. Sample-and-hold circuit 350 comprises at least two switching elements 333-334 and two storage elements 335-336. Switching elements 333-334 might comprise transistors, transmission gates, analog switches, or other elements. Control of switching elements 333-334 is provided by an external control circuit, such as control circuit 140 of FIG. 1, which produces a switching signal having a duty cycle. Example duty cycles include a 1% duty cycle, with switching elements 333-334 in an active or 'on' configuration for 1% of the time. Based on this duty cycle of ~1%, a reduction in status current draw for bandgap circuit 330 can be reduced to ~100 nA from the 10 µA of FIG. 2. Upon each sample cycle provided by activation of switching elements 333-334, a value of each reference voltage is sampled from terminals 331-332 and held in storage elements 335-336. These storage elements typically comprise capacitance elements, such as capacitors. The capacitors might comprise various types and technologies, such as surface mount capacitors, multilayered ceramic chip capacitors (MLCC), semiconductor capacitors, as well as electrolytic or ceramic capacitors.

Once storage elements 335-336 sample and hold Vrefhi and Vreflo, storage elements 335-336 can provide the held samples over links 343-344 to offset trim DAC circuit 320. Links 343 and 344 are each coupled to corresponding gate switches 324-329. Each of gate switches 324-329 represents at least two switching elements, with one switching element coupled to Vrefhi and one switching element coupled to Vreflo. The gate switching elements can be enabled/disabled to selectively couple either Vrefhi or Vreflo to corresponding gates of each transistor pair 321-323. A digital code provided by a control circuit is used to control these gate switching elements, where each code bit position can correspond to a particular pair of transistors 321-323 and control gate switches for that pair. Based on this digital code, Vrefhi, and Vreflo, as well as the topology of transistor pairs 321-323 in offset trim DAC circuit 320, a control circuit, such as control circuit 140 of FIG. 1, interprets the digital code to control activation or inactivation of gate switches 324-329. Responsive to the selective activation or inactivation of gate switches 324-329, a current is produced through each transistor of transistor pairs 321-323. This current is produced over nodes 'A' and 'B' in FIG. 3, where all 'A' nodes are coupled together, and all 'B' nodes are coupled together. This trim current is provided through nodes 'A' and 'B' to op-amp input stage 310 via links 341-342. Differences in the trim current produced among node 'A' and node 'B' can be used to adjust for offsets and inaccuracies in op-amp input stage 310 by way of input stage transistor pair 313. In this manner, offset trim DAC circuit 320 converts a digital code supplied by an external circuit or user into an analog current for adjustment of input offsets among individual transistors of transistor pair 313 in op-amp input stage 310.

The relative sizing among transistor pairs 321-323 can allow a granular portion of a trim current to be produced by individual ones among transistor pairs 321-323 based on the control of gate switches 324-329. In FIG. 3, a first transistor feature size 'X' is shown for transistor pair 321 to represent a first granular increment in current, a second transistor feature size '2X' is shown for transistor pair 322 to represent a second granular increment in current, and a third transistor feature size '16X' is shown for transistor pair 323 to represent a third granular increment in current. For any given value of 'X', the feature sizes scale up according to the multiplier value (e.g. 2 or 16) to produce a correspondingly largest incremental current. Typically, more transistor pairs than shown in FIG. 3 are included in offset trim DAC circuit 320, such as eight (8), and a representative set is shown in FIG. 3 for clarity. Similarly, the feature size of op-amp input stage 310 has a feature size of '128X'.

This configuration shown in FIG. 3 can provide for correction of offsets within op-amp input stage 310 using a reduced static power dissipation and current draw. However, gate switching via gate switches 324-329 in offset trim DAC circuit 320 can still have various leakages on links 343-344. During the hold period of sample-and-hold circuit 350, voltages stored in storage elements 335-336 will droop due to leakages on these nodes through gate switches 324-329.

Typically, gate switches 324-329 each comprise one or more transistors, such as NMOS, PMOS, or CMOS transistors. When NMOS transistors are employed, for example, then the bulk is typically coupled to a reference potential or ground and the gate is coupled to a control signal. Thus, in FIG. 3, Vrefhi and Vreflo voltages stored in storage elements 335-336 are applied to source or drain terminals of the associated transistors of gate switches 324-329 which can affect the stored voltage levels in storage elements 335-336 and force a higher duty cycle than desired to refresh the stored voltage levels with a new sample period. NMOS transistors, when employed, would have individual ones of the NMOS transistors that are coupled to Vrefhi experience a higher body diode voltage (e.g. 0.44 volts) than NMOS transistors that are coupled to Vreflo (e.g. 0.4 volts). For digital codes that have a larger quantity of NMOS transistors in an 'on' state connected to Vrefhi, then the leakage present on link 343 that supplies Vrefhi will be higher than that on link 344 that supplies Vreflo. This can also increase current dissipation when the applied digital code changes NMOS transistors from being coupled from Vrefhi to Vreflo for affected NMOS transistors. A differential leakage for transistor pairs 321-323 can be experienced on Vrefhi and Vreflo at approximately 2 picoamps (pA), when a hold time of 40 ms is employed for sample and hold circuit 350 and storage elements 335-336 comprise 4 picofarad (pF) capacitors. This can lead to an error=(2 pA/4 pF)*40 ms=20 mV on Vrefhi−Vreflo. For the op-amp circuit associated with op-amp input stage 310, this error can translate to a further undesirable error at the op-amp output of 20 mV/4=5 mV.

Figure 4:
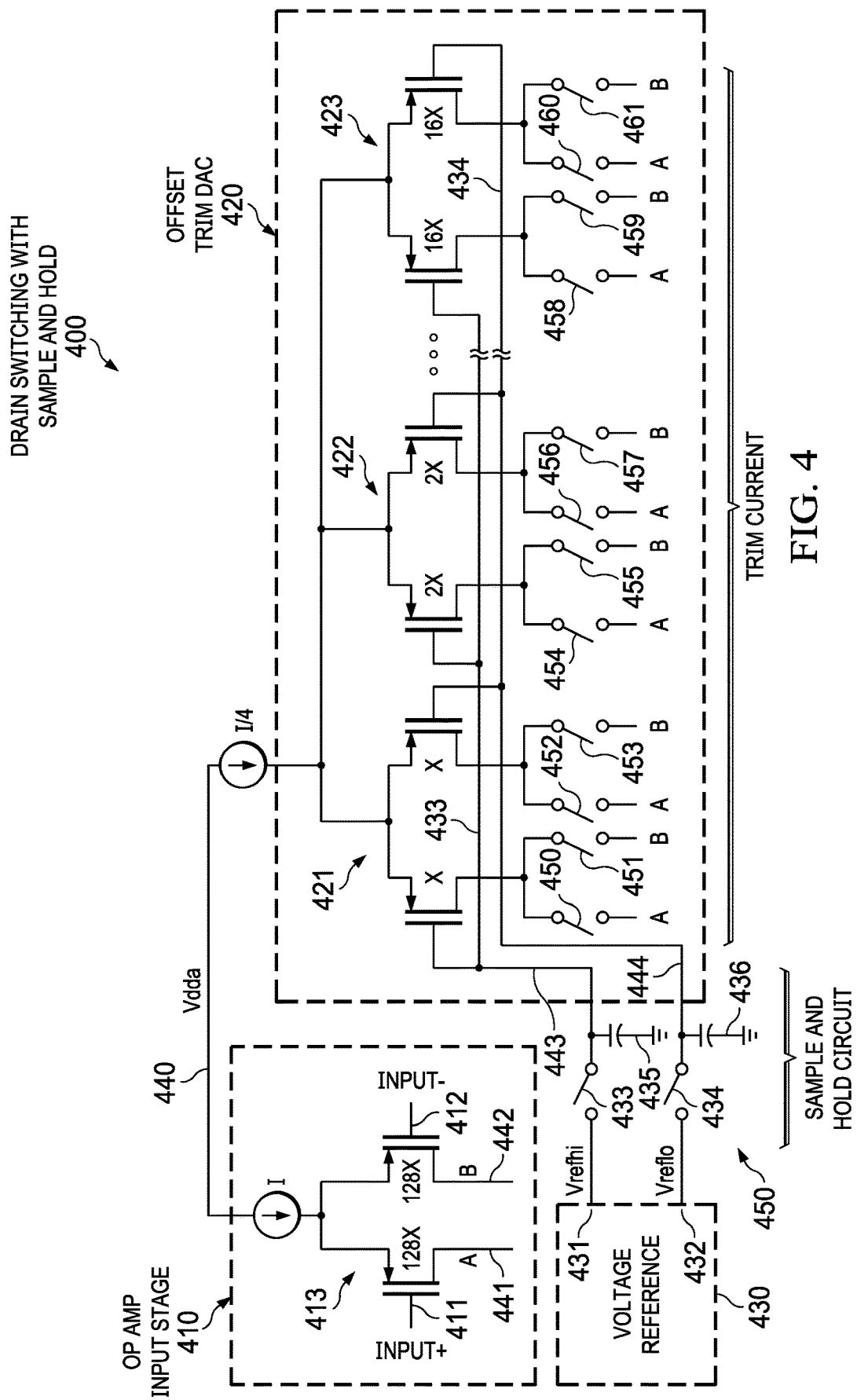
FIG. 4 illustrates portions of an operational amplifier and portions of a trim circuit in an implementation.

To provide a second enhanced circuit topology, FIG. 4 is provided. As with FIG. 3, FIG. 4 includes a sampling circuit 450 that accompanies a bandgap reference circuit 430 to reduce the required current of the bandgap reference circuit shown in FIG. 2. FIG. 4 also includes a different control configuration and circuit topology than that shown in FIG. 3 with regard to gate switching. Specifically, FIG. 4 incorporates an enhanced drain switching topology shown by example circuit configuration 400 for a DAC-based trim circuit. Example control circuits can include control circuit 140 of FIG. 1 or control system 801 of FIG. 8.

FIG. 4 includes four main portions comprising circuit configuration 400, namely op-amp input stage 410, offset trim DAC circuit 420, bandgap circuit 430, and sample-and-hold circuit 450. Offset trim DAC circuit 120 of FIG. 1 might incorporate some of the elements of DAC-based trim circuit 420 of FIG. 4, and it should be understood that offset trim DAC circuit 120 can instead employ different configurations as described in FIG. 4. Also, a supply voltage 440 (Vdda) is included to illustrate a voltage source for current to be supplied to op-amp input stage 410 and offset trim DAC circuit 420. The particular voltage level will vary based upon implementation, but might comprise 3.3-12 volts, among other voltage levels. Other configurations of supply voltage can be employed, such as separate supply voltages.

Typically, an op-amp will have an input stage portion that accepts one or more external signals for amplification to produce an output based on a gain characteristic of a gain stage. In FIG. 4, op-amp input stage 410 illustrates an example input stage portion of op-amp 110 of FIG. 1 or input stage 216 of FIG. 2. In this instance, input signals to the input stage comprise differential inputs having positive and negative input terminals. Specifically, op-amp input stage 410 accepts two input signals 411-412 which form a differential input configuration formed by input+ signal 411 and input− signal 412. Based on input signals 411-412 as well as a gain configuration of a differential gain stage (not shown in FIG. 4 for clarity), an associated op-amp that includes op-amp input stage 410 can produce an output signal. This output signal can have various inaccuracies which arise at least in part from variations among circuitry that forms op-amp input stage 410. Specifically, input each transistor in transistor pair 413 might have slightly different characteristics due to manufacturing irregularities, thermal differences, non-linearities, sizing inaccuracies, or other factors. A correction signal, referred to herein as a trim signal or trim current, can be introduced into op-amp input stage 410 at nodes 'A' and 'B' on links 441-442 to compensate for at least a portion of the input stage offset among transistor pair 413. In FIG. 1, this trim signal is indicated by trim signals 121-122, and in FIG. 4 a trim current is represented by two currents at nodes 'A' and 'B' which can each adjust for characteristics of a particular transistor among transistor pair 413.

Bandgap circuit 430 provides at least two reference voltages to offset trim DAC circuit 420 (Vrefhi and Vreflo) at terminals 431-432. Sample-and-hold circuit 450 is positioned between terminals 431-432 and links 443 and 444. Example reference voltages provided by bandgap circuit 430 might correspond to voltage levels of 0.44 volts for Vrefhi and 0.4 volts for Vreflo presented at terminals 431-432 of bandgap circuit 430. Sample-and-hold circuit 450 comprises at least two switching elements 433-434 and two storage elements 435-436. Switching elements 433-434 might comprise transistors, transmission gates, analog switches, or other elements. Control of switching elements 433-434 is provided by an external control circuit, such as control circuit 140 of FIG. 1, which produces a switching signal having a duty cycle. Example duty cycles include a 1% duty cycle, with switching elements 433-434 in an active or 'on' configuration for 1% of the time. Upon each sample cycle provided by activation of switching elements 433-434, a value of each reference voltage is sampled from terminals 431-432 and held in storage elements 435-436.

Once storage elements 435-436 sample and hold Vrefhi and Vreflo, storage elements 435-436 can provide the held samples over links 443-444 to offset trim DAC circuit 420. Links 443 and 444 are each coupled to corresponding gates of each transistor pair 421-423. No switching elements coupled to the gates of the transistors pairs 421-423 are employed in FIG. 4. Instead, in some examples, each of links 443-444 are directly coupled to gate terminals of selected transistors in each transistor pair 421-423. Although links 443 and 444 are shared among each transistor pair, other examples might include separate links for each gate of each transistor pair as well as further sample and hold instances. In FIG. 4, a 'left' transistor of each pair is coupled to link 443 carrying a sample of Vrefhi and a 'right' transistor in each pair is coupled to link 444 carrying a sample of Vreflo.

Figure 7:
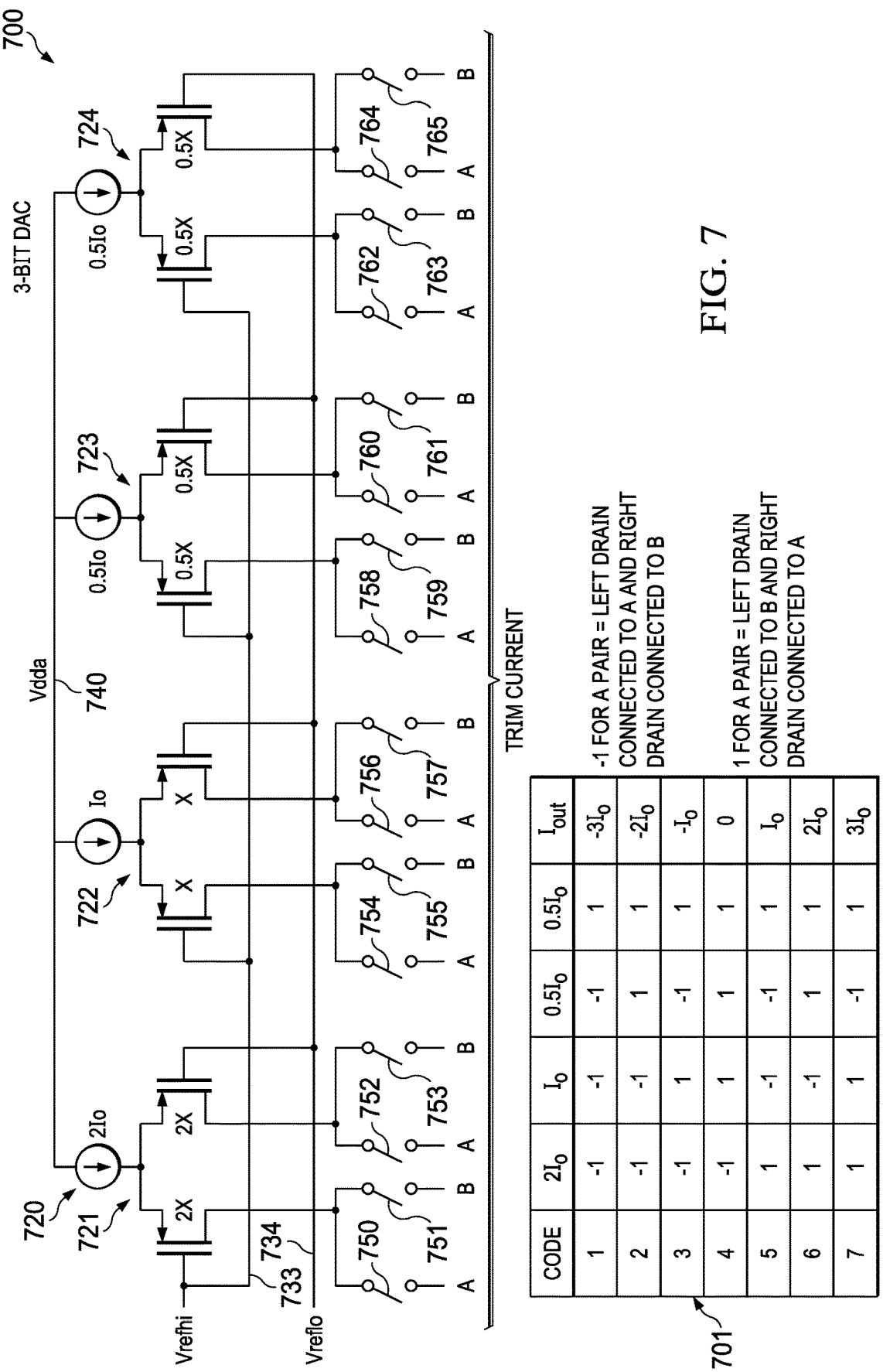
FIG. 7 illustrates control of an operational amplifier trim circuit in an implementation.

Drain switching elements 450-461 are included in offset trim DAC 420. Each transistor of transistor pairs 421-423 has a drain terminal coupled to a dedicated drain switching element, while the source terminals are coupled to a voltage/current source shown for Vdda 440. The drain switching elements can be enabled/disabled to selectively couple a particular transistor of transistor pairs 421-423 to either the 'A' or 'B' nodes. A digital code is used to control drain switching elements 450-461, where each code bit position can correspond to a particular pair of transistors 421-423 and control drain switches for that pair. An example control scheme is illustrated in FIG. 7. Based on this digital code, a selected drain switch for each transistor of transistor pairs 421-423 is enabled or disabled. Responsive to the selective activation or inactivation of drain switches 450-461, a current is produced through each transistor of transistor pairs 421-423. This current is produced at 'A' and 'B' nodes in FIG. 4, where all 'A' nodes are coupled together, and all 'B' nodes are coupled together. This trim current is provided at nodes 'A' and 'B' to op-amp input stage 410 via links 441-442. Differences in the trim current produced among node 'A' and node 'B' can be used to adjust for offsets and inaccuracies in op-amp input stage 410 by way of input stage transistor pair 413. In this manner, offset trim DAC circuit 420 converts a digital code supplied by an external circuit or user into an analog current for adjustment of input offsets among individual transistors of transistor pair 413 in op-amp input stage 410.

The relative sizing among transistor pairs 421-423 can allow a granular portion of a trim current to be produced by individual ones among transistor pair 421-423 based on the control of drain switches 450-461. In FIG. 4, a first transistor feature size 'X' is shown for transistor pair 421 to represent a first granular increment in current, a second transistor feature size '2X' is shown for transistor pair 422 to represent a second granular increment in current, and a third transistor feature size '16X' is shown for transistor pair 423 to represent a third granular increment in current. For any given value of 'X', the feature sizes scale up according to the multiplier value (e.g. 2 or 16) to produce a correspondingly largest incremental current. Typically, more transistor pairs than shown in FIG. 4 are included in offset trim DAC circuit 420, such as eight (8), and a representative set is shown in FIG. 4 for clarity. Similarly, the feature size of op-amp input stage 410 has a feature size of '128X'.

Typically, drain switches 450-461 each comprise one or more transistors, such as NMOS, PMOS, or CMOS transistors. When NMOS transistors are employed, then drain terminals of drain switches 450-461 are coupled to source terminals of associated transistors of transistor pairs 421-423. Source terminals of drain switches 450-461 are coupled to associated nodes 'A' and 'B'. Gate terminals of drain switches 450-461 are coupled to control signaling, such as the aforementioned digital code, which activates/deactivates selected drain switches 450-461 to produce the desired trim current. FIG. 7 illustrates example control signaling for control of an example trim circuit that incorporates drain switches.

This configuration shown in FIG. 4 can provide for correction of offsets within op-amp input stage 410 using less power dissipation and current draw than provided by circuitry in other examples. The configuration shown in FIG. 4 eliminates gate terminal parasitic losses via gate switches, such as may be experienced by gate switches 324-329 in offset trim DAC circuit 320 in FIG. 3. Voltages stored in storage elements 435-436 will experience very little droop due to extremely small leakages (attoamp range) through gate terminals of transistors of transistor pairs 421-423. In FIG. 4, a drain switching technique is employed to produce the trim current, which avoids any switching losses on the Vrefhi and Vreflo signals provided over links 443-444. Vrefhi–Vreflo is kept constant for transistor pairs 421-423 in FIG. 4 by the use of drain switching. Advantageously, the gate leakage of transistor pairs 421-423 is on the order of attoamps (aA) and does not vary among different digital codes applied to offset trim DAC circuit 420.

Figure 5:
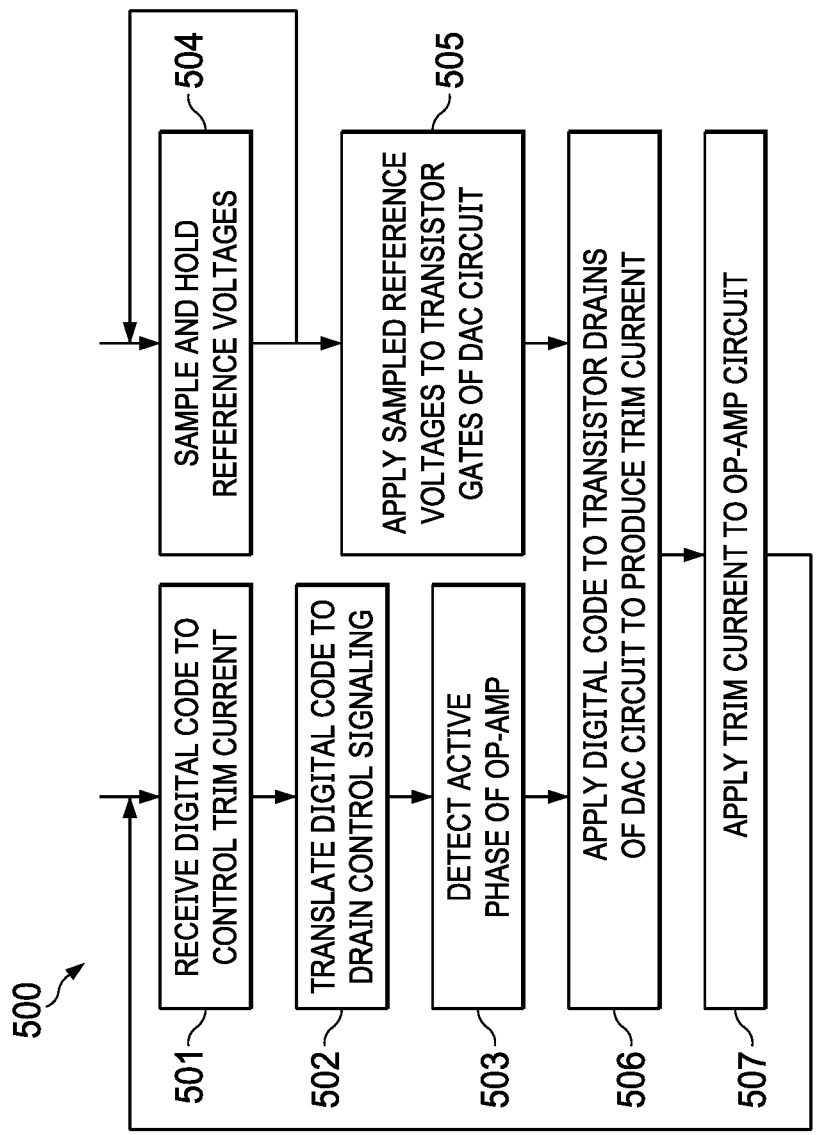
FIG. 5 illustrates control operations for an operational amplifier trim circuit in an implementation.

FIG. 5 is now presented which discusses example operations of a circuit that employs enhanced drain switching to control a DAC trim current. The operations of FIG. 5 can be in the context of any of the elements in the accompanying Figures. However, for illustrative purposes, the operations will be discussed in the context of elements of FIG. 4 and control circuit 140 of FIG. 1.

In FIG. 5, control circuit 140 receives (501) a digital code to control a trim current. This trim current is used to correct for errors in outputs of a target op-amp, and is introduced into an input stage of the op-amp. In FIG. 4, this input stage comprises op-amp input stage 410 which has trim currents at nodes 'A' and 'B' provided over links 441-442. Control circuit 140 can receive a digital code to granularly select among magnitudes and/or polarities of trim currents. Control circuit 140 translates (502) this digital code to drain control signaling of drain switches 450-461. Specifically, control circuit 140 determines on/off states for each of drain switches 450-461 to produce the desired trim currents over nodes 'A' and 'B' in FIG. 4. Gate control of drain switches 450-461 is produced by gate driver circuitry of offset trim DAC circuit 420 or control circuit 140.

This drain control signaling determined based on the digital code might be applied constantly or during selective time periods in some examples. However, in this example, control circuit 140 applies the drain control signaling during active phases of the target op-amp. Thus, control circuit 140 detects (503) active phases of the target op-amp, such as based on control signaling of the target op-amp, digital control indicators, enable indicators for the target op-amp, or based upon a predetermined duty cycle. When the target op-amp is in an inactive phase, then all of drain switches 450-461 will be held in an inactive state by control circuit 140. Responsive to the active phases, control circuit 140 produces drain control signaling which takes selected ones of drain switches 450-461 from inactive states to active states.

Concurrent with the drain control signaling operations, control circuit 140 can control operation of sample and hold circuit 450. Specifically, control circuit 140 can control switching elements 433-434 to activate (504) and capture a sample of Vrefhi and Vreflo in storage elements 435-436. This control of switching elements 433-434 can occur according to a predetermined duty cycle. The duty cycle is determined based on the leakage experienced by switching elements 435-436 to maintain a sampled/held voltage level within a target range of the Vrefhi/Vreflo source voltage levels. Gate control of switching elements 433-434 is produced by gate driver circuitry of offset trim DAC circuit 420 or control circuit 140. These sampled and held voltages on storage elements 435-436 are applied (505) to transistor gates of offset trim DAC circuit 420. In FIG. 4, storage elements 435-436 are constantly coupled to gates of transistor pairs 421-423. However, when a configuration like FIG. 3 is employed, then gate switches might be enabled by control circuit 140 to apply the sampled and held voltages to selected transistor pairs.

Control circuit 140 applies (506) a digital code to transistor drains of offset trim DAC circuit 420 to produce trim currents. The digital code might be translated into drain control signals, as mentioned in operation 502. Then these drain control signals can be applied to control drain switches 450-461. Typically, gate terminals of drain switches 450-461 will have the drain control signals applied thereto. Responsive to the application of the digital code or relevant drain control signals, transistor pairs 421-423 of offset trim DAC circuit 420 will each produce a portion of a trim current. This trim current can then be applied (507) to the target op-amp circuit. Specifically, FIG. 4 shows trim current nodes 'A' and 'B' coupled to links 441-442 of op-amp input stage 410. These trim currents, when applied, will draw a current through one or more of the transistors of transistor pair 413 in op-amp input stage 410 and correct for offsets that affect input+ 411 and input− 412 within op-amp input stage 410 and the target op-amp.

Figure 6:
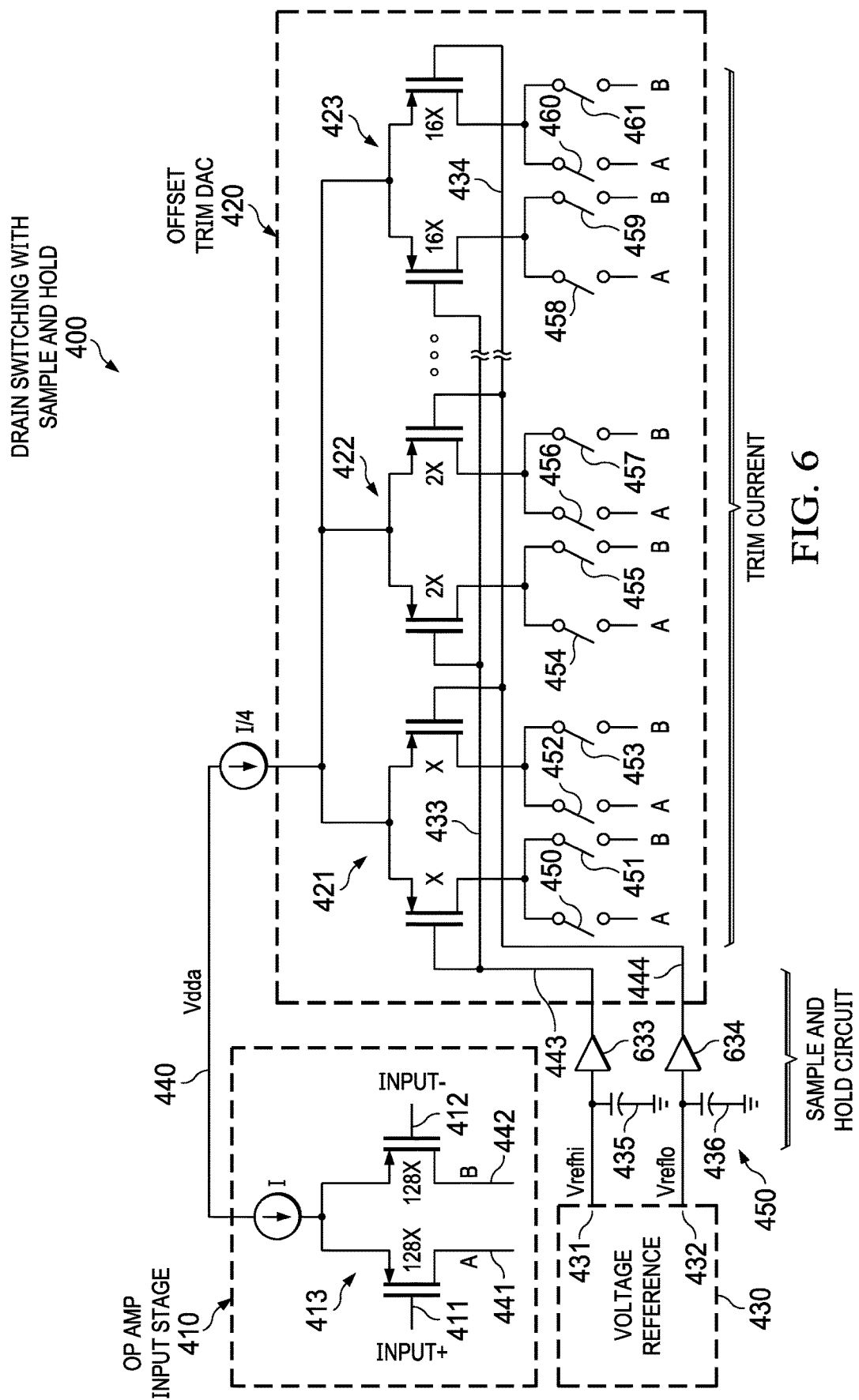
FIG. 6 illustrates portions of an operational amplifier and portions of a trim circuit in an implementation.

To provide another enhanced circuit topology, FIG. 6 is provided. FIG. 6 includes similar elements discussed above for FIG. 4. However, FIG. 6 includes an alternate arrangement for sample and hold circuit 450. Namely, FIG. 6 includes buffer circuitry 633-634 between storage elements 435-436 and links 443-444. Buffer circuitry 633-634 can comprise analog buffers, transmission gates, or other low-power buffers. This alternative configuration can reduce leakages on storage elements 435-436. However, the buffers might add corresponding voltage offsets and inaccuracies onto links 443-444 which can vary with temperature. Nonetheless, the configuration shown in FIG. 6 might be employed when electrical buffering is desired between storage elements 435-436 and links 443-444.

FIG. 7 now is presented to illustrate control scenarios which can be applied to the circuitry found in the various Figures herein. FIG. 7 includes an example circuit 700 comprising a DAC trim circuit, namely a 3-bit DAC trim circuit 720 that employs a drain switching configuration. DAC trim circuit 720 can be one example of offset trim DAC circuit 420 in FIG. 4, such as when offset trim DAC circuit 420 comprises a 3-bit configuration. The control scenarios which are described in FIG. 7 can thus be applied to control offset trim DAC circuit 420 in FIG. 4.

Table 701 indicates an example translation of a digital code for controlling DAC trim circuit 720. The digital code is translated into drain control signaling for each transistor pair in DAC trim circuit 720. This example of control schemes for DAC trim circuit 720 can also be applied in a similar manner for larger bit DACs, such as a 6-bit DAC or greater. The use of this drain switching control scheme, as well as the sample and hold circuitry, can reduce op-amp voltage offsets from ~10 mV to ~1 mV. Enhanced control of the duty cycle of an associated sample and hold circuity for a bandgap voltage reference can reduce current draw for the bandgap voltage reference to less than 100 nA.

In FIG. 7, DAC trim circuit 720 includes four transistor pairs 721-724, each comprising two transistors having associated relative transistor feature sizes from 2X to 0.5X in size. Each source terminal of transistor pairs 721-724 is coupled to a source voltage/current of Vdda 740. Each gate terminal of transistor pairs 721-724 is coupled to a particular one among Vrefhi and Vreflo, as indicated in FIG. 7 over links 733-734. Furthermore, a voltage reference circuit and sample-and-hold circuit, such as shown in FIG. 4, are not shown in FIG. 7 for simplicity. Each drain terminal of transistor pairs 721-724 is coupled to a corresponding drain switching element 750-765. Each of drain switching elements 750-765 comprises one or more transistors, such as an NMOS transistor with source terminals coupled to associated transistors of transistor pairs 721-724, gate terminals coupled to control signaling, and drain terminals coupled to nodes 'A' and 'B'. Each of nodes 'A' are coupled together and each of nodes 'B' are coupled together to form a trim current, referred to in FIG. 7 as $I_{OUT}$.

Table 701 shows example translations among digital code bits in the first column to control signaling for each of transistor pairs 721-724. The digital code has three bits in this example, and thus can vary from 0-7 in decimal (or 000 to 111 in binary). The column headers listed in table 701 after the digital code each correspond to a different transistor pair among transistor pairs 721-724 and is indicated by the granular current contribution of the corresponding transistor pair. Specifically, transistor pair 721 corresponds to the second column of table 701, transistor pair 722 corresponds to the third column of table 701, transistor pair 723 corresponds to the fourth column of table 701, and transistor pair 724 corresponds to the fifth column of table 701. A value in these columns corresponds to activation/inactivation states of drain switches that are tied to each transistor pair, which selectively couples left or right transistors in each transistor pairs to 'A' or 'B' nodes. A '−1' value in table 701 indicates that a drain of a left transistor of a corresponding transistor pair is connected through a drain switch to the 'A' node, while the drain of a right transistor of the corresponding transistor pair is connected through a drain switch to the 'B' node. A '1' value in table 701 indicates that a drain of a left transistor of a corresponding transistor pair is connected through a drain switch to the 'B' node, while the drain of a right transistor of the corresponding transistor pair is connected through a drain switch to the 'A' node.

In a specific control example for transistor pair 721 (as indicated in the second column of table 701), when the digital code indicates a '1' code (001 in binary), then a '−1' value is indicated to control transistor pair 721. This '−1' value indicates to couple the left transistor of transistor pair 721 through activated drain switch 750 to node 'A' while drain switch 751 is inactivated. Concurrently, the right transistor of transistor pair 721 is coupled to node 'B' through activated drain switch 753 to node 'B' while drain switch 752 is inactivated. In another specific control example for transistor pair 721 (as indicated in the second column of table 701), when the digital code indicates a '4' code (100 in binary), then a '1' value is indicated to control transistor pair 721. This '1' value indicates to couple the left transistor of transistor pair 721 through activated drain switch 751 to node 'B' while drain switch 750 is inactivated. Concurrently, the right transistor of transistor pair 721 is coupled to node 'A' through activated drain switch 752 to node 'A' while drain switch 753 is inactivated. Similar control for other transistor pairs and digital codes can be achieved.

As discussed above for FIG. 1, control circuit 140 can control drain switching elements, such as drain switching elements 750-765. Control circuit 140 can translate the digital code in the first column of table 701 into the '−1' and '1' indicators in columns 2-5 of table 701. The '−1' and '1' values can be used to control gate terminals of drain switching elements 750-765. Finally, once all of the transistor pairs have been selectively coupled through drain switching elements 750-765 to specific ones of nodes 'A' and 'B', a composite trim current is produced by DAC trim circuit 720. This trim current can be introduced to an input stage of a target op-amp, such as those discussed above. A sixth column of table 701 indicates corresponding trim currents for each value of the digital code. These trim currents are in relative multiples of $I_O$, which vary from negative polarity −3 $I_O$ currents to positive polarity +3 $I_O$ currents. Thus, each transistor pair produces a granular portion of an analog current according to the applied digital code.

Figure 8:
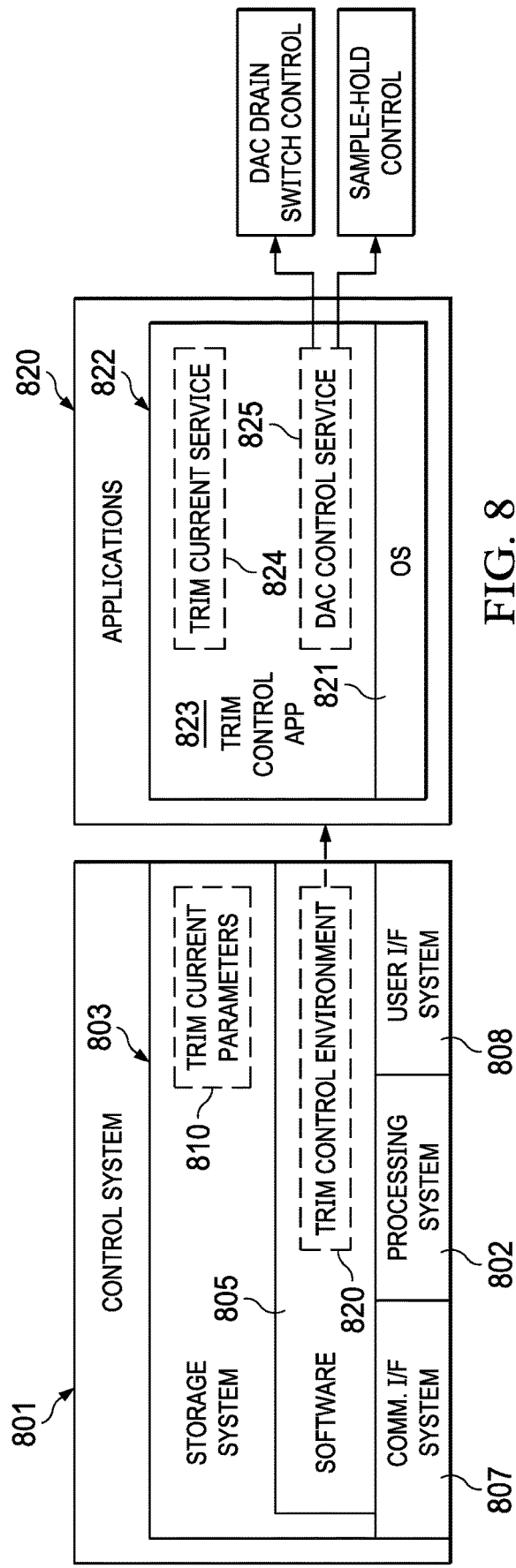
FIG. 8 illustrates a control system to control operational amplifier trim circuitry according to an implementation.

FIG. 8 illustrates control system 801 that is representative of any control system, monitor system, or collection of systems in which the various operational architectures, scenarios, and processes disclosed herein may be implemented. For example, control system 801 can be used to implement control circuitry 140, control portions of offset trim DAC 120, control portions of any offset trim DAC discussed herein, or portions of any other instance of control circuitry, input circuitry, user interface circuitry, or monitoring circuitry discussed herein. Moreover, control system 801 can be used to receive digital codes for control of trim currents, translate digital codes into gate switching control or drain switching control, control sample and hold operations according to a duty cycle, and monitor for active phases of target operational amplifier circuitry, among other operations. In yet further examples, control system 801 can fully implement a control and monitoring system, such as that illustrated in FIG. 1, to control DAC circuitry for producing trim currents and correct for offsets in op-amp circuitry. Control system 801 can implement control of any of the enhanced operations discussed herein, whether implemented using hardware or software components, or any combination thereof.

Examples of control system 801 include computers, smartphones, tablet computing devices, laptops, desktop computers, hybrid computers, rack servers, web servers, cloud computing platforms, cloud computing systems, distributed computing systems, software-defined networking systems, and data center equipment, as well as any other type of physical or virtual machine, and other computing systems and devices, as well as any variation or combination thereof. Control system 801 may be implemented as a single apparatus, system, or device or may be implemented in a distributed manner as multiple apparatuses, systems, or devices. Control system 801 includes processing system 802, storage system 803, software 805, communication interface system 807, and user interface system 808. Processing system 802 is operatively coupled with storage system 803, communication interface system 807, and user interface system 808.

Processing system 802 loads and executes software 805 from storage system 803. Software 805 includes trim control environment 820, which is representative of processes discussed with respect to the preceding Figures. When executed by processing system 802 to implement and enhance trim current control operations, software 805 directs processing system 802 to operate as described herein for at least the various processes, operational scenarios, and sequences discussed in the foregoing implementations. Control system 801 may optionally include additional devices, features, or functionality not discussed for purposes of brevity.

Referring still to FIG. 8, processing system 802 may include a microprocessor and processing circuitry that retrieves and executes software 805 from storage system 803. Processing system 802 may be implemented within a single processing device, but may also be distributed across multiple processing devices, sub-systems, or specialized circuitry, that cooperate in executing program instructions and in performing the operations discussed herein. Examples of processing system 802 include general purpose central processing units, application specific processors, and logic devices, as well as any other type of processing device, combinations, or variations thereof.

Storage system 803 may include any computer readable storage media readable by processing system 802 and capable of storing software 805, and capable of optionally storing status of DAC circuitry, status of target op-amp circuitry, digital codes for controlling trim current circuitry, translation tables between digital codes and drain switch signals, sample-and-hold duty cycle information, op-amp offset voltage information, and other information. Storage system 803 may include volatile and nonvolatile, removable and non-removable media implemented in any method or technology for storage of information, such as computer readable instructions, data structures, program modules, or other data. Examples of storage media include random access memory, read only memory, magnetic disks, optical disks, flash memory, virtual memory and non-virtual memory, magnetic cassettes, magnetic tape, magnetic disk storage or other magnetic storage devices, resistive storage devices, magnetic random-access memory devices, phase change memory devices, or any other suitable non-transitory storage media. In addition to computer readable storage media, in another implementation storage system 803 may also include computer readable communication media over which at least portions of software 805 may be communicated internally or externally. Storage system 803 may be implemented as a single storage device, but may also be implemented across multiple storage devices or sub-systems co-located or distributed relative to each other. Storage system 803 may include additional elements, such as a controller, capable of communicating with processing system 802 or possibly other systems.

Software 805 may be implemented in program instructions and among other functions may, when executed by processing system 802, direct processing system 802 to operate as described with respect to the various operational scenarios, sequences, and processes illustrated herein. For example, software 805 may include program instructions for controlling and interfacing with trim current circuitry, among other operations. In particular, the program instructions may include various components or modules that cooperate or otherwise interact to carry out the various processes and operational scenarios described herein. The various components or modules may be embodied in compiled or interpreted instructions, or in other variations or combination of instructions. The various components or modules may be executed in a synchronous or asynchronous manner, serially or in parallel, in a single threaded environment or multi-threaded, or in accordance with any other suitable execution paradigm, variation, or combination thereof. Software 805 may include additional processes, programs, or components, such as operating system software or other application software, in addition to or that included in trim control environment 820. Software 805 may also comprise firmware or some other form of machine-readable processing instructions executable by processing system 802.

In general, software 805 may, when loaded into processing system 802 and executed, transform a suitable apparatus, system, or device (of which control system 801 is representative) overall from a general-purpose computing system into a special-purpose control system customized to facilitate controlling and interfacing trim current circuitry. Indeed, encoding software 805 on storage system 803 may transform the physical structure of storage system 803. The specific transformation of the physical structure may depend on various factors in different implementations of this description. Examples of such factors may include, but are not limited to, the technology used to implement the storage media of storage system 803 and whether the computer-storage media are characterized as primary or secondary storage, as well as other factors. For example, if the computer readable storage media are implemented as semiconductor-based memory, software 805 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

Trim control environment 820 includes one or more software elements, such as OS 821 and applications 822. These elements can describe various portions of control system 801 with which elements of trim current production/control systems or external systems can interface or interact. For example, OS 821 can provide a software platform on which application 822 is executed and allows for enhanced operations to receive digital codes for control of trim currents, translate digital codes into gate switching control or drain switching control, control sample and hold operations according to a duty cycle, and monitor for active phases of target operational amplifier circuitry.

In one example, trim control application 823 comprises trim current service 824 and DAC control service 825. Service 824 can receive digital codes for control of trim currents and translate those digital codes into transistor control signaling, such as drain control signaling. Service 824 might maintain a table or data structure of translation information to convert from digital codes into transistor control signaling. Service 824 can also receive indications of duty cycles for sample-and-hold circuitry and translate those indications into transistor control signaling to sample reference voltages for a DAC circuit. These translations for transistor control signaling can be pre-programmed/predetermined or might instead be user programmable over user interface system 808 or over communication interface 807. Service 825 can produce control signals for controlling DAC-based trim currents. These control signals can include logic-level signals or specific voltage-level signals in an analog or digital domain for control of DAC drain switches or sample-and-hold switches. In some examples, these control signals can control other circuitry, such as gate driver circuitry, for control of DAC drain switches or sample-and-hold switches. Communication interface system 807, discussed below, might be employed to communicate between software/firmware elements of trim control application 823 and hardware elements of DAC circuitry and sample-and-hold circuitry.

Communication interface system 807 may include communication connections and devices that allow for communication with other computing systems (not shown) over communication networks (not shown). Communication interface system 807 might also communicate with portions of DAC trim current circuitry, trim current circuitry, sample-and-hold circuitry, gate terminals of transistors in DAC trim current circuitry, gate driver circuitry, and other circuitry. Examples of connections and devices that together allow for inter-system communication may include discrete communication links, memory interfaces, network interface cards, antennas, power amplifiers, RF circuitry, transceivers, and other communication circuitry. The connections and devices may communicate over communication media to exchange communications or data with other computing systems or networks of systems, such as metal, glass, air, or any other suitable communication media.

User interface system 808 is optional and may include a keyboard, a mouse, a voice input device, a touch input device for receiving input from a user. Output devices such as a display, speakers, web interfaces, terminal interfaces, and other types of output devices may also be included in user interface system 808. User interface system 808 can provide output and receive input over a data interface or network interface, such as communication interface system 807. User interface system 808 may also include associated user interface software executable by processing system 802 in support of the various user input and output devices discussed above. Separately or in conjunction with each other and other hardware and software elements, the user interface software and user interface devices may support a graphical user interface, a natural user interface, or any other type of user interface. User interface system 808 might provide a programming interface or user interface which can accept programmable values for digital codes, trim currents, trim current polarities, and duty cycles for sample-and-hold circuitry to be applied to control trim current circuitry and other associated circuitry.

Communication between control system 801 and other computing systems (not shown), may occur over a communication network or networks and in accordance with various communication protocols, combinations of protocols, or variations thereof. Examples include intranets, internets, the Internet, local area networks, wide area networks, wireless networks, wired networks, virtual networks, software defined networks, data center buses, computing backplanes, or any other type of network, combination of network, or variation thereof. The aforementioned communication networks and protocols are well known and need not be discussed at length here. However, some communication protocols that may be used include, but are not limited to, the Internet protocol (IP, IPv4, IPv6, etc.), the transmission control protocol (TCP), and the user datagram protocol (UDP), as well as any other suitable communication protocol, variation, or combination thereof.

What is claimed is:

1. A circuit comprising:
 a reference circuit comprising a first reference voltage node and a second reference voltage node;
 a digital-to-analog conversion (DAC) circuit comprising a plurality of transistor pairs, wherein each transistor pair of the plurality of transistor pairs comprises a first transistor and a second transistor, wherein a source terminal of the first transistor is coupled to a source terminal of the second transistor, wherein a gate terminal of the first transistor is coupled to a first pair of switches, wherein a gate terminal of the second transistor is coupled to a second pair of switches, wherein a first switch of the first pair of switches is coupled to a first node, wherein a second switch of the first pair of switches is coupled to a second node, wherein a first switch of the second pair of switches is coupled to the first node, wherein a second switch of the second pair of switches is coupled to the second node;
 a third switch coupled to the first node and to the first reference voltage node; and
 a fourth switch coupled to the second node and to the second reference voltage node.

2. The circuit of claim 1, further comprising a control circuit configured to control the first pair of switches and the second pair of switches of each transistor pair of the plurality of transistor pairs according to a digital code.

3. The circuit of claim 1, further comprising a first capacitor coupled to the first node and a second capacitor coupled to the second node.

4. The circuit of claim 1, wherein each transistor among the plurality of transistor pairs comprises a source terminal coupled to a current supply.

5. The circuit of claim 1, wherein a drain terminal of the first transistor of each transistor pair is coupled together, and a drain terminal of the second transistor of each transistor pair is coupled together.

6. The circuit of claim 5, further comprising an operational amplifier, comprising:
 a current source;
 a first input transistor coupled between the current source and the first node; and
 a second input transistor coupled between the current source and the second node.

7. The circuit of claim 6, wherein:
 the operational amplifier further includes a first differential input and a second differential input;
 the first input transistor includes a gate coupled to the first differential input; and
 the second input transistor includes a gate coupled to the second differential input.

8. A circuit comprising:
 a reference circuit comprising a set of reference voltage nodes and comprising one or more bandgap reference elements;
 a sample and hold circuit coupled to the reference circuit, the sample and hold circuit comprising a first node, a second node, a first storage element, a second storage element, a first buffer, and a second buffer, the first node coupled to a first reference voltage node of the reference voltage nodes, to the first storage element, and to the first buffer, the second node coupled to a second reference voltage node of the reference voltage nodes, to the second storage element, and to the second buffer;
 a digital-to-analog conversion (DAC) circuit coupled to the sample and hold circuit and comprising a plurality of transistor pairs, wherein a first transistor of each transistor pair is coupled to the first buffer, wherein a second transistor of each transistor pair is coupled to the second buffer, wherein transistors of each transistor pair are coupled together; and
 drain switching elements coupled to drain terminals of the first and second transistors of each transistor pair.

9. The circuit of claim 4, further comprising an input stage, comprising:
 a first current generator coupled to a first node;

a first transistor coupled to the first node; and
a second transistor coupled to the first node.

10. The circuit of claim 9, wherein the first current generator is coupled to a second current generator and the second current generator is coupled to a source terminal of each transistor of the transistor pairs.

11. The circuit of claim 9, wherein the input stage further includes:
- a first differential input and a second differential input;
- the first transistor includes a gate terminal coupled to the first differential input; and
- the second transistor includes a gate terminal coupled to the second differential input.

12. The circuit of claim 8, wherein each transistor among the plurality of transistor pairs comprises a drain terminal coupled to two associated drain switching elements.

13. The circuit of claim 8, wherein the drain switching elements include:
- a first set of drain switching elements each coupled between a respective transistor of the plurality of transistor pairs and a first node common to each of the first and second transistors of the plurality of transistor pairs; and
- a second set of drain switching elements each coupled between a respective transistor of the plurality of transistor pairs and a second node common to each of the first and second transistors of the plurality of transistor pairs.

14. An operational amplifier trim circuit comprising:
- a first storage element;
- a second storage element;
- a plurality of transistor pairs, wherein each of the plurality of transistor pairs includes a first transistor that includes a first gate coupled to the first storage element and a second transistor that includes a second gate coupled to the second storage element; and
- pairs of switching elements coupled to drain terminals of transistors among the transistor pairs and configured to selectively couple one or more portions of a trim current to an operational amplifier in accordance with a control code.

15. The operational amplifier trim circuit of claim 14, further comprising:
- a first switch having a first terminal coupled to the first storage element and a second terminal coupled to a first reference voltage node; and
- a second switch having a first terminal coupled to the second storage element and a second terminal coupled to a second reference voltage node.

16. The operational amplifier trim circuit of claim 15, further comprising a reference circuit, the reference circuit comprising the first reference voltage node and the second reference voltage node; and further comprising a plurality of bandgap reference elements.

17. The operational amplifier trim circuit of claim 14, wherein a first pair of switching elements is coupled to a drain terminal of the first transistor, and a second pair of switching elements is coupled to a drain terminal of the second transistor.

18. The operational amplifier trim circuit of claim 14, further comprising an input stage, comprising:
- a first current generator coupled to a first node;
- a first transistor coupled to the first node; and
- a second transistor coupled to the first node.

19. The operational amplifier trim circuit of claim 18, wherein the input stage further includes:
- a first differential input and a second differential input;
- the first transistor includes a gate terminal coupled to the first differential input; and
- the second transistor includes a gate terminal coupled to the second differential input.

20. The operational amplifier trim circuit of claim 18, wherein the first current generator is coupled to a second current generator and the second current generator is coupled to a source terminal of each transistor of the transistor pairs.

* * * * *